United States Patent
Hsiung

(10) Patent No.: US 6,788,541 B1
(45) Date of Patent: Sep. 7, 2004

(54) LED MATRIX MOLDULE

(76) Inventor: Bear Hsiung, 5F, No. 30, Lane 179, Sec. 2, Nei Hu Rd., Nei-Hu, Taipei (TW)

( * ) Notice: Subject to any disclaimer, the term of this patent is extended or adjusted under 35 U.S.C. 154(b) by 0 days.

(21) Appl. No.: 10/430,398

(22) Filed: May 7, 2003

(51) Int. Cl.[7] .............................. H05K 7/20; H01L 23/34
(52) U.S. Cl. ........................ 361/719; 361/711; 257/713; 257/720; 313/500
(58) Field of Search ................................ 361/704–712, 361/717–719; 257/705–707, 712, 713, 720, 796; 116/202; 313/498–500

(56) References Cited

U.S. PATENT DOCUMENTS

| | | | | |
|---|---|---|---|---|
| 4,127,792 A | * | 11/1978 | Nakata ....................... | 313/500 |
| 4,165,474 A | * | 8/1979 | Myers ........................ | 313/500 |
| 4,225,380 A | * | 9/1980 | Wickens ..................... | 438/32 |
| 4,241,281 A | * | 12/1980 | Morimoto et al. .......... | 315/161 |
| 4,280,273 A | * | 7/1981 | Vincent ....................... | 438/28 |
| 4,575,765 A | * | 3/1986 | Hirt ............................ | 348/800 |
| 4,729,076 A | * | 3/1988 | Masami et al. ............. | 362/235 |
| 4,845,405 A | * | 7/1989 | Yamane et al. ............. | 313/500 |
| 5,404,282 A | * | 4/1995 | Klinke et al. ............... | 362/249 |
| 5,621,225 A | * | 4/1997 | Shieh et al. ................. | 257/81 |
| 5,780,321 A | * | 7/1998 | Shieh et al. ................. | 438/34 |
| 5,857,767 A | * | 1/1999 | Hochstein ................... | 362/294 |
| 6,291,274 B1 | * | 9/2001 | Oida et al. .................. | 438/123 |
| 6,428,189 B1 | * | 8/2002 | Hochstein ................... | 362/373 |
| 6,480,389 B1 | * | 11/2002 | Shie et al. ................... | 361/707 |
| 6,517,218 B2 | * | 2/2003 | Hochstein ................... | 362/294 |
| 6,617,613 B2 | * | 9/2003 | Matsuo et al. .............. | 257/79 |
| 6,650,048 B2 | * | 11/2003 | Wu .............................. | 313/512 |
| 6,713,956 B2 | * | 3/2004 | Hsing Chen et al. ....... | 313/512 |
| 2003/0116769 A1 | * | 6/2003 | Song et al. .................. | 257/79 |
| 2003/0178627 A1 | * | 9/2003 | Marchl et al. .............. | 257/80 |
| 2004/0000727 A1 | * | 1/2004 | Hsu ............................. | 257/787 |
| 2004/0061433 A1 | * | 4/2004 | Izuno et al. ................. | 313/498 |

FOREIGN PATENT DOCUMENTS

KR  2002035819 A  *  5/2002  ........... H01L/33/00

* cited by examiner

Primary Examiner—Anatoly Vortman
(74) Attorney, Agent, or Firm—Browdy and Neimark, P.L.L.C.

(57) ABSTRACT

An LED matrix module of the invention has a circuit board, a thermally conductive plate and a plurality of LED chips. A plurality of slots is formed through a circuit surface and a bonding surface of the circuit board. A positive trace and a negative trace respectively extend from an edge of the circuit board. The thermally conductive plate is attached onto the bonding surface of the circuit board. The LED chips are respectively mounted through the slots of the circuit board in a manner to attach on the thermally conductive plate. Each LED chip is further electrically connected to the positive and negative traces on the circuit surface of the circuit board respectively via a positive electrode wire and a negative electrode wire. The LED chips are directly attached onto the thermally conductive plate through which the heat dissipates. The high brightness of the LED is thereby ensured.

9 Claims, 4 Drawing Sheets

LED MATRIX MOLDULE

BACKGROUND OF THE INVENTION

1. Field of the Invention

The invention relates to an LED matrix module and, more particularly, to an LED matrix module in which a plurality of LED chips are respectively mounted through slots formed through a circuit board.

2. Description of the Related Art

The association of photoelectric elements into visual signs enables the creation of light effects that increase visual attention. When an LED matrix structure is integrated into a commercial signboard, the advertisement layout is outlined over the light from the LED matrix to render the advertisement more visible and attractive. Therefore, the photoelectric element must be provided with enough brightness to attract the attention of a passerby. However, an effective heat dissipation of the highly bright light is critical for maintaining a normal operation of the photoelectric element. Furthermore, the signboard usually has a large area. Therefore, an effective assembly process is needed to easily and efficiently assemble the large signboard.

Referring to FIG. 1, a conventional LED matrix structure includes a circuit board (not shown), an LED matrix 1 and a casing 2. The LED matrix 1 is mounted on a first surface of the circuit board. Then, the LED matrix 1 is molded in a plastic mold and baked to form the casing 2. Thereafter, traces 10 are routed from a second surface opposite the first surface of the circuit board.

In the above LED matrix structure, the brightness of the LED structure usually deteriorates due to poor heat dissipation. Furthermore, since the LED matrix is mounted on the circuit board and molded to form the casing, the whole LED matrix structure is undesirably thick. The complex manufacture process further reduces the yield and thus increases failure rate. Moreover, a molding equipment is required, which increases the production cost. Yet another drawback of the conventional art is that in order to assemble the LED matrix in the casing while complying with the trace layout of the circuit board, the circuit surface of the circuit board usually must not be flat.

SUMMARY OF THE INVENTION

It is therefore an object of the invention to provide an LED matrix module with increased brightness, reduced size, and lower failure rate, and further with a simplified production process.

In order to achieve the above and other objectives, an LED matrix module of the invention includes a circuit board, a thermally conductive plate and a plurality of LED chips. The circuit board has a circuit surface and a bonding surface opposite the circuit surface. A plurality of slots is formed through the circuit surface and the bonding surface. A positive trace and a negative trace respectively extend from an edge of the circuit board. The thermally conductive plate is attached onto the bonding surface of the circuit board. The LED chips are respectively mounted through the slots of the circuit board in a manner to attach thereon the thermally conductive plate. Each LED chip is further electrically connected to the positive and negative traces on the circuit surface of the circuit board respectively via a positive electrode wire and a negative electrode wire.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
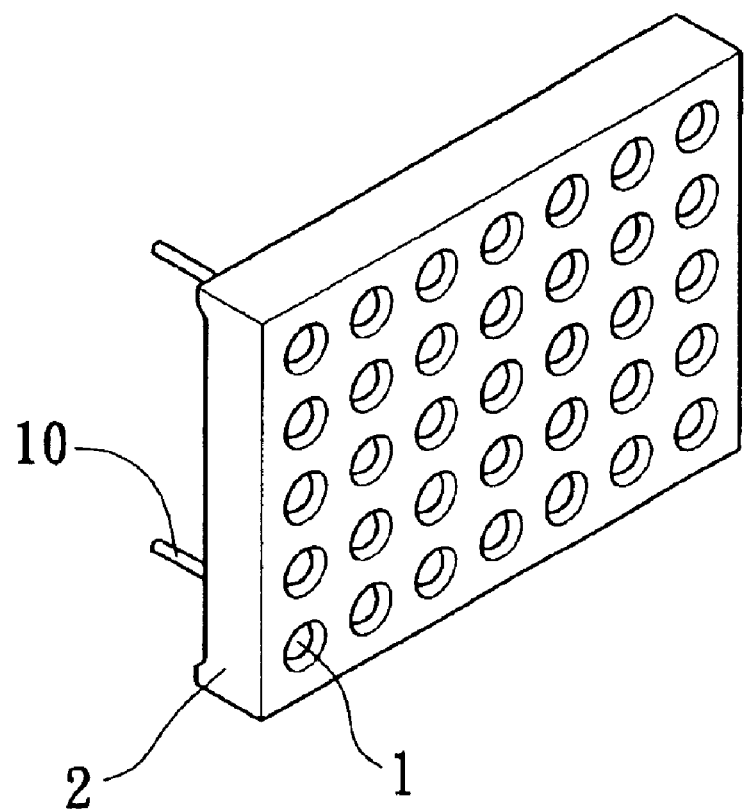
FIG. 1 is a perspective view of a conventional LED matrix module.

Wherever possible in the following description, like reference numerals will refer to like elements and parts unless otherwise illustrated.

Figure 2:
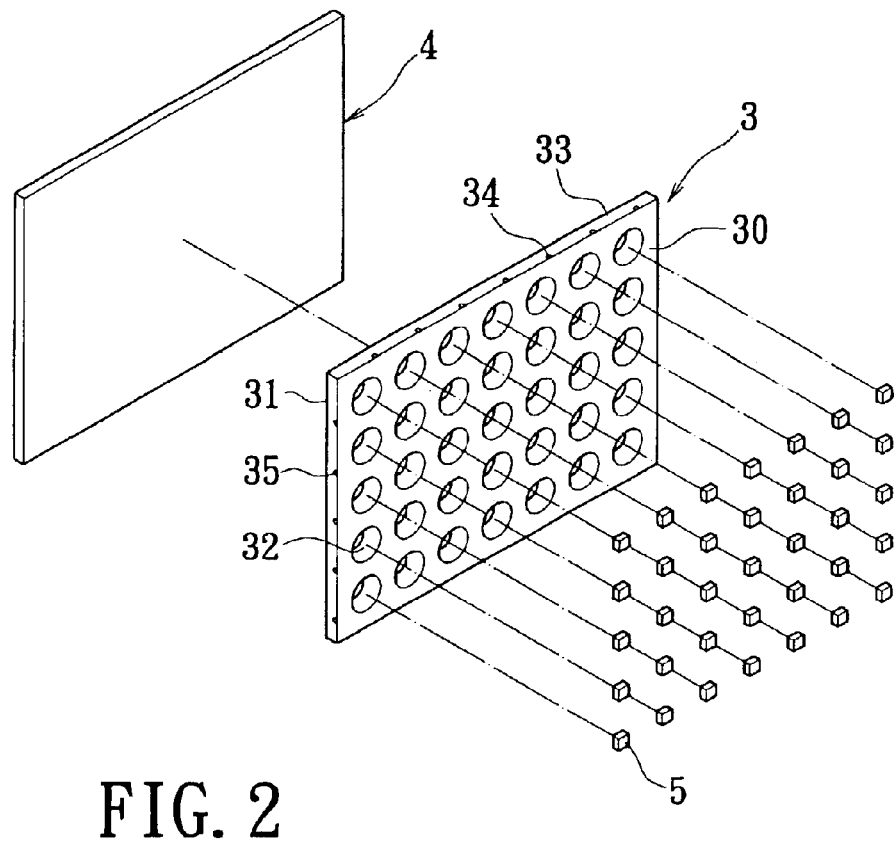
FIG. 2 is an exploded view of an LED matrix module according to one embodiment of the invention.
Figure 3:
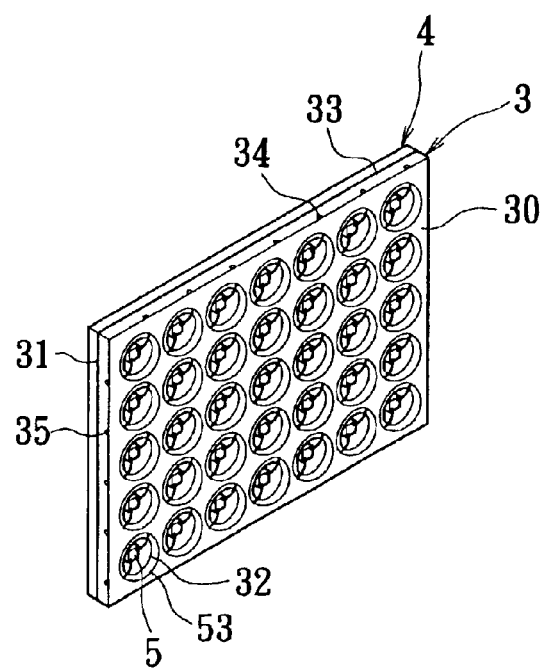
FIG. 3 is a perspective view of an LED matrix module according to one embodiment of the invention.
Figure 4:
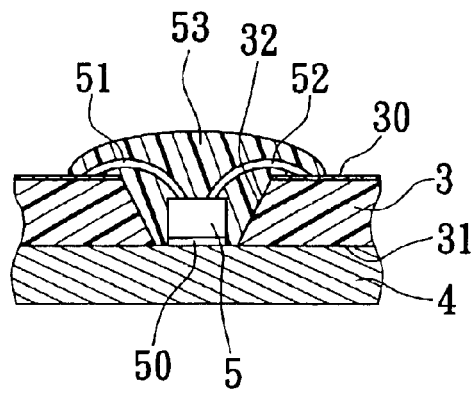
FIG. 4 is a schematic, cross-sectional view of an LED matrix module according to one embodiment of the invention.

Referring to FIG. 2 to FIG. 4, the invention provides an LED matrix module including a circuit board 3, a thermally conductive plate 4 and a plurality of LED chips 5.

The circuit board 3 has a circuit surface 30 and a bonding surface 31 opposite the circuit surface 30. The circuit board 3 has a plurality of slots 32 formed through the circuit surface 30 and the bonding surface 31. The circuit board 3 is, for example, a bi-layered or multi-layered circuit board. A positive trace 34 and a negative trace 35 respectively extend from an edge 33 of the circuit board 3.

The thermally conductive plate 4 is attached onto the bonding surface 31 of the circuit board 3. The thermally conductive plate 4 is a metal plate with a reflective anti-oxidation material applied thereon.

The LED chips 5 are respectively mounted in the slots 32 of the circuit board 3 and thus attached onto the thermally conductive plate 4. A thermally conductive paste 50 is applied between the respective LED chips 5 and the thermally conductive plate 4. Each LED chip 5 is further electrically connected to positive and negative traces on the circuit surface 30 of the circuit board 3 respectively via a positive electrode wire 51 and a negative electrode wire 52. A transparent paste 53 encapsulates the LED chips 5, the positive electrode wire 51 and the negative electrode wire 52 to prevent oxidation. The circuit surface 30 of the circuit board 3 is further provided with a square focus lens (not shown) in a location corresponding to the LED chips 5.

In the LED matrix module of the invention, the slots 32 are formed through the circuit board 3 for receiving the LED chips 5. The LED chips 5 are mounted in the slots and attached onto the thermally conductive plate 4. The thermally conductive plate 4 promotes heat dissipation from the LED chips 5. Furthermore, the conventional circuit design can be applied to the circuit board 3. The thermally conductive plate 4 has a smooth surface that allows easy assembly.

Figure 5:
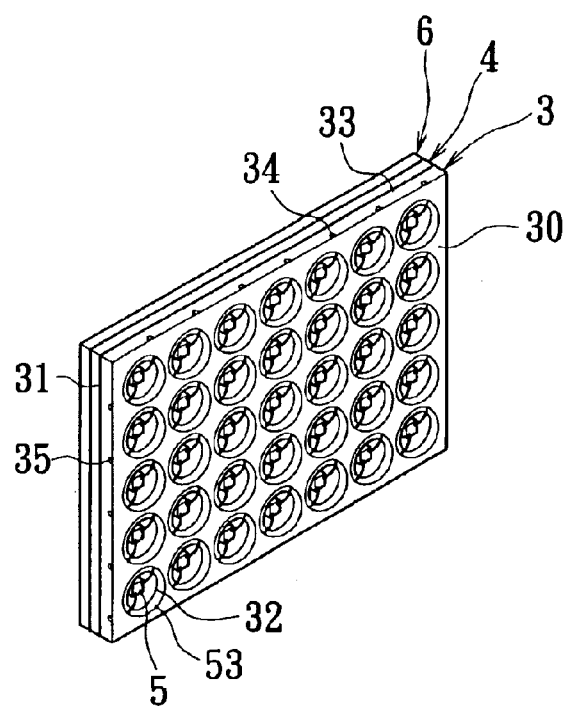
FIG. 5 is a perspective view of an LED matrix module assembled with a magnet according to one embodiment of the invention.
Figure 6:
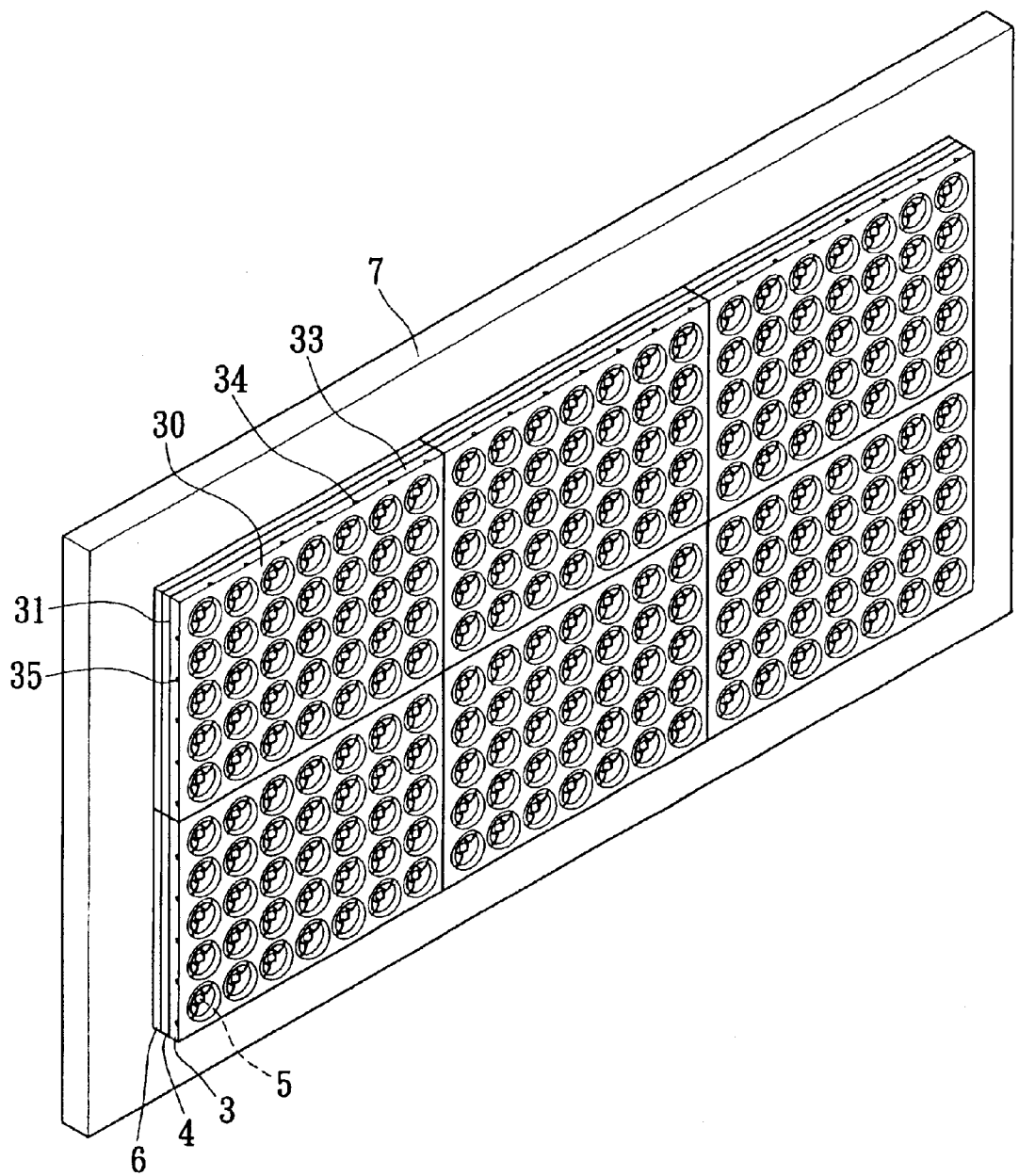
FIG. 6 is a perspective view of an LED matrix module mounted on an external part according to one embodiment of the invention.

Referring to FIG. 5, a magnet 6 is further mounted on the thermally conductive plate 4 opposite the circuit board 3. Referring to FIG. 6, the magnet 6 is attracted to an external metallic part 7 to position temporarily the circuit board 3. A plurality of circuit boards 3 can be arranged to form a signboard. The magnets 6 on the circuit boards 3 are attached to one another by magnetic attraction and then bonded by soldering. Thereby, the assembly is more efficiently achieved and is higher in quality. The positive trace 34 and negative trace 35 extended from the edge 33 of one circuit board 3 of one LED matrix module respectively connect to those from another circuit board 3 of another LED matrix module. The trace connection is easily achieved. Furthermore, the LED matrix modules are easily packed up, which reduces the occupation space.

As described above, the LED matrix module of the invention has at least the following advantages.

1. The LED chip is directly attached onto the thermally conductive plate through which the heat can be dissipated. The high brightness of the LED is ensured and the brightness per unit area of the LED is increased. Furthermore, the LED chips are respectively mounted inside the slots of the circuit board, which reduces the thickness of the LED matrix module.

2. The formation of the slots through the circuit board enables mounting the LED chips in a manner to allow direct contact with the thermally conductive plate. The fabrication process is thus simplified and the yield of manufacture, which now does not require molding, increased. The conventional circuit design can be applied to the circuit board of the LED matrix module of the invention. Therefore, there is no increase in production cost.

3. The positive trace and the negative trace extended from one circuit board of one LED matrix module respectively connect to those from another circuit board of another LED matrix module. The trace connection is easily achieved by magnetic attraction. Furthermore, the LED matrix modules are easily packed up, which reduces the occupation space.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An LED (light emitting diode) matrix module, comprising
   a circuit board, having a circuit surface and a bonding surface opposite the circuit surface, a plurality of slots being formed through the circuit surface and the bonding surface, wherein a positive trace and a negative trace respectively extend from an edge of the circuit board;
   a thermally conductive plate, attached onto the bonding surface of the circuit board; and
   a plurality of LED chips, respectively mounted through the slots of the circuit board in a manner to attach onto the thermally conductive plate, wherein each LED chip is further electrically connected to the positive and negative traces on the circuit surface of the circuit board respectively via a positive electrode wire and a negative electrode wire.

2. The LED matrix module of claim 1, wherein the circuit board is a bi-layered circuit board.

3. The LED matrix module of claim 1, wherein the circuit board is a multi-layered circuit board.

4. The LED matrix module of claim 1, wherein the thermally conductive plate is a metallic plate with a reflective anti-oxidation material applied thereon.

5. The LED matrix module of claim 1, wherein a thermally conductive paste is applied between the respective LED chips and the thermally conductive plate.

6. The LED matrix module of claim 1, wherein a transparent paste respectively encapsulates the LED chips, the positive electrode wire and the negative electrode wire.

7. The LED matrix module of claim 1, wherein the circuit surface of the circuit board is further provided with a square focus lens located corresponding to the LED chips.

8. The LED matrix module of claim 1, wherein said LED matrix module is one of a plurality of LED matrix modules, and wherein the positive trace and the negative trace extended from one circuit board of one LED matrix module respectively connect to those from another circuit board of another LED matrix module.

9. The LED matrix module of claim 1, wherein said LED matrix module is one of a plurality of LED matrix modules, and wherein a magnet is further mounted on the thermally conductive plate opposite the circuit board, whereby magnets of neighboring circuit boards of others LED matrix modules are attached to one another by magnetic attraction and then bonded by soldering.

* * * * *